(12) United States Patent  (10) Patent No.: US 8,334,162 B2
Catalano et al.  (45) Date of Patent: Dec. 18, 2012

(54) SYSTEM AND METHOD FOR TRACKING AND REMOVING COATING FROM AN EDGE OF A SUBSTRATE

(75) Inventors: Michael Catalano, Toledo, OH (US); Stephen P. Murphy, Perrysburg, OH (US); Steven W. Diderich, Beloit, WI (US)

(73) Assignee: First Solar, Inc, Perrysburg, OH (US)

( * ) Notice: Subject to any disclaimer, the term of this patent is extended or adjusted under 35 U.S.C. 154(b) by 269 days.

(21) Appl. No.: 12/887,176

(22) Filed: Sep. 21, 2010

(65) Prior Publication Data

US 2011/0095004 A1  Apr. 28, 2011

Related U.S. Application Data

(60) Provisional application No. 61/244,524, filed on Sep. 22, 2009.

(51) Int. Cl.
*B05D 5/12* (2006.01)
*H01L 31/00* (2006.01)

(52) U.S. Cl. .......... 438/57; 438/795; 438/940; 427/554; 427/74; 219/121.68; 219/121.69; 219/121.83; 136/256

(58) Field of Classification Search .................... 438/57, 438/795, 940, 73; 427/534, 535, 554–559, 427/74; 134/1, 1.1, 1.3; 219/121.68, 121.69, 219/121.83; 136/256; 428/323, 689; 257/E31.001
See application file for complete search history.

(56) References Cited

U.S. PATENT DOCUMENTS

| 6,265,328 | B1 | 7/2001 | Henley et al. |
| 6,423,565 | B1 | 7/2002 | Barth et al. |
| 6,485,839 | B1 | 11/2002 | Nagarkar et al. |
| 6,874,510 | B2 | 4/2005 | Reder et al. |
| RE39,001 | E | 3/2006 | Lundquist et al. |
| 7,262,115 | B2 | 8/2007 | Baylis et al. |
| 7,495,757 | B2 * | 2/2009 | Kim .......................... 356/237.1 |
| 2002/0127824 | A1 | 9/2002 | Shelton et al. |
| 2005/0020087 | A1 | 1/2005 | Wagner et al. |
| 2005/0189013 | A1 | 9/2005 | Hartley |
| 2005/0268963 | A1 | 12/2005 | Jordan et al. |
| 2007/0234564 | A1 | 10/2007 | Shafir |
| 2009/0077805 | A1 | 3/2009 | Bachrach et al. |
| 2010/0159634 | A1 | 6/2010 | Su et al. |
| 2010/0184244 | A1 * | 7/2010 | Hunt ............................... 438/57 |
| 2010/0265497 | A1 | 10/2010 | Tsai et al. |

* cited by examiner

*Primary Examiner* — Samuel M Heinrich
(74) *Attorney, Agent, or Firm* — Dickstein Shapiro LLP

(57) ABSTRACT

A method for removing coating from a substrate may include: locating an edge of a substrate; directing a laser beam along a first path to a first position on a surface of the substrate proximate to an edge of the substrate at an angle of incidence suitable to redirect the laser beam along a second path, through the substrate, to a second position on a second surface of the substrate corresponding to the located edge of the substrate, where the second surface can include a coating; and ablating at least a portion of coating at the second position on the second surface of the substrate.

20 Claims, 11 Drawing Sheets

FIG. 7

SYSTEM AND METHOD FOR TRACKING AND REMOVING COATING FROM AN EDGE OF A SUBSTRATE

CLAIM FOR PRIORITY

This application claims priority under 35 U.S.C. §119(e) to U.S. Provisional Patent Application Ser. No. 61/244,524 filed on Sep. 22, 2009, which is hereby incorporated by reference.

TECHNICAL FIELD

The present invention relates to photovoltaic devices and methods of production.

BACKGROUND

Photovoltaic devices can include semiconductor material deposited over a substrate, for example, with a first layer serving as a window layer and a second layer serving as an absorber layer. The semiconductor window layer can allow the penetration of solar radiation to the absorber layer, such as a cadmium telluride layer, which converts solar energy to electricity. Photovoltaic devices can also contain one or more transparent conductive oxide layers, which are also often conductors of electrical charge.

DETAILED DESCRIPTION

A photovoltaic device can include a transparent conductive oxide layer adjacent to a substrate and layers of semiconductor material. The layers of semiconductor material can include a bi-layer, which may include an n-type semiconductor window layer, and a p-type semiconductor absorber layer. The n-type window layer and the p-type absorber layer may be positioned in contact with one another to create an electric field. Photons can free electron-hole pairs upon making contact with the n-type window layer, sending electrons to the n side and holes to the p side. Electrons can flow back to the p side via an external current path. The resulting electron flow provides current, which combined with the resulting voltage from the electric field, creates power. The result is the conversion of photon energy into electric power.

It is often necessary to delete portions of semiconductor material and other coatings from the edges of photovoltaic devices. For example, industry requirements dictate that photovoltaic devices maintain a minimum non-conductive width around their perimeters. It is thus advantageous to control the width of the non-conductive region to maximize the output of the photovoltaic device. Traditional methods of controlling edge width, such as precision fixtures and XY positioning tables, are typically expensive and require considerable downtime to maintain the precise positioning tolerances desired. An alternative is to use an edge-tracking instrument to locate the edge of a photovoltaic device. The position of a coating-removal device can then be adjusted based on the non-coated edge requirement. After deleting a portion of coating from the edge, the coating-removal device can be readjusted and reactivated until the non-coated edge requirement is met. Similarly, the photovoltaic device can be adjusted to permit coating removal on an adjacent region of the edge to achieve the same non-coated edge width for the adjacent region.

A method for removing coating from a substrate may include: locating an edge of a substrate; directing a laser beam along a first path to a first position on a surface of the substrate proximate to an edge of the substrate at an angle of incidence suitable to redirect the laser beam along a second path, through the substrate, to a second position on a second surface of the substrate corresponding to the located edge of the substrate, where the second surface can include a coating; and ablating at least a portion of coating at the second position on the second surface of the substrate.

The method may include various optional features. For example, the method can include scanning the laser beam along a region proximate to the located edge of the substrate. The scanning can include adjusting a substrate to one or more new positions. The scanning can include adjusting a laser source to one or more new positions. The scanning can include forming one or more contiguous non-coated sections adjacent to a first non-coated section. The ablating can include forming a first non-coated section. The first non-coated section can substantially equate to a minimum non-coated edge width. The ablating can include forming one or more contiguous non-coated sections, where the combination of the one or more contiguous non-coated sections and the first non-coated section can substantially equate to a minimum non-coated edge width. The method can include adjusting a substrate to one or more new positions. The adjusting can include repositioning the substrate in a horizontal plane, a vertical plane, or both. The method can include adjusting a laser source to one or more new positions. The adjusting can include repositioning the laser source in a horizontal plane, a vertical plane, or both.

A system for removing coating from a substrate may include: a first data interface operable to receive and communicate data relating to one or more edges of a substrate; a second data interface operable to receive and communicate data relating to one or more edges of a substrate; a sensor in communication with the first data interface, where the sensor can be operable to detect and track the edge of a substrate and further operable to output a location edge identifier via the first data interface, and where the location edge identifier can define the location of an edge of a substrate; a controller in communication with the sensor, where the controller can be configured to receive the location edge identifier from the sensor via the first data interface, and to output an adjustment signal based on the received location edge identifier; and a coating-removal device configured to remove a portion of coating from an edge of a substrate to form one or more non-coated sections, where the coating-removal device comprises a laser source.

The system may include various optional features. For example, the controller may be further configured to receive an edge width identifier, and to output an adjustment signal based on the edge width identifier, where the edge width identifier defines a minimum edge width for a substrate. The system can include an actuator, where the actuator can be configured to receive the adjustment signal from the controller via the second data interface. The actuator can be configured to adjust a substrate to one or more new positions based on the received adjustment signal. The actuator can be configured to reposition the substrate in a horizontal plane, a vertical plane, or both. The actuator can be configured to adjust a mounting plate to one or more new positions based on the received adjustment signal. The actuator can be configured to adjust the mounting plate in a horizontal plane, a vertical plane, or both. The mounting plate can include a gap, such that two portions of the mounting plate lie partially separate and parallel from each other. The gap can be configured to receive a substrate. The coating-removal device can be mounted along an edge of the gap. The coating-removal device can be positioned on the mounting plate. The controller can be positioned on the mounting plate. The sensor can be positioned on the mounting plate. The sensor may include an ultrasonic, infrared, non-contact, hall effect, proximity, or photodiode sensor.

A laser scribing apparatus can include a laser source that provides a pulsed laser beam with a wavelength at a near-infrared fundamental frequency and having a pulse frequency in the range of about 50 to about 100 kilohertz and a pulse duration in the range of about 8 to about 70 nanoseconds. The laser source can be a diode-pumped, Q-switched, neodymium-doped, yttrium vanadate laser source providing a pulsed laser beam with a wavelength at its near-infrared fundamental frequency of about 1064 nanometers and operating at a pulse frequency in the range of about 50 to about 100 kilohertz with the pulse duration in the range of about 8 to about 70 nanoseconds. The pulsed laser beam can be reflected by one or more mirrors to an XYZ galvanometer controlled mirror system that directs the laser beam to perform the scribing. More specifically, the XYZ galvanometer controlled mirror system can include a galvanometer controlled focuser that moves a lens horizontally to control the focal length of the beam in the Z direction and a galvanometer controlled dual mirror assembly that directs the beam in the XY directions so as to thereby collectively provide XYZ control.

The scribing can be performed by directing a laser beam through the uncoated surface of a substrate to its coated surface, and through to the different areas for the scribing, with the layers scribed being controlled by the power level of the laser for each of the scribes. By laser scribing of the scribes from the uncoated surface of the substrate, there is no gas plume formed by the ablations that provide the scribing such that the plumes cannot prevent the next laser pulses from passing through the coatings to provide each next ablation.

The laser scribing apparatus can include gas pressure and vacuum positioners that maintain the substrate planar at its uncoated surface and position the substrate laterally with respect to the direction of conveyance so the focused pulsed laser beam has its focus in the Z direction at the layer or layers being scribed. These positioners are located in vertically extending sets both upstream and downstream of the location where the laser beam passes through the glass sheet substrate to provide the laser scribing. There can be five of the positioners upstream of the scribing location and five of the positioners downstream of the scribing location. Each of the positioners can have a central location to which a vacuum is applied from a vacuum source through an associated conduit. An annular porous member f each positioner can extend around the location and receive pressurized gas from a gas source through an associated conduit. The positioners can position the uncoated glass sheet surface within about 4 to about 6 microns so as to provide an accurate location for the laser beam focusing and the ablations at the layer or layers being scribed.

Laser detectors located upstream from the scribing location can provide laser detection beams that are reflected back from the uncoated surface to detect the exact position of the substrate, and through connection to the focuser of the galvanometer mirror system focus the pulsed scribing laser beam in response to the position detected throughout the range of movement and scribing of the scribing laser beam. This detection can accommodate for any nonplanarity of the substrate such as roller waves formed when a glass substrate is manufactured.

The laser scribing station conveyor can provide a conveying index between each laser scribe during which the coated substrate is held stationary such that the laser beam moves vertically to perform the scribing, after first having been adjusted horizontally to provide the proper spacing between the previously formed adjacent scribe. It is also possible for the coated substrate to be continuously conveyed along the direction of conveyance, and the path of the laser scribes is then angular both along the direction of conveyance and with respect to a true vertical direction, and after the completion of each scribe, there is a reset motion of the galvanometer controlled mirror system such that the complete pass has a generally bow tie configuration.

Prior to conveyance to the first scribing station, the two upper corners of the coated substrate are laser marked with respective fiducials which are detected by a pair of cameras so as to provide a signal for accurate location of the panel and the spacing between the fiducials so that the scribing can be accurately located. This allows adjustment as necessary for thermal expansion or contraction and for different spacings between the fiducials on different substrates. In addition, each substrate can be provided with a bar code that is sensed by a bar code reader so as to provide identification of each particular substrate being scribed. In addition, the apparatus includes an exhaust hood that receives the exhaust from the coated side of the substrate being scribed. To insure that the scribing is performed at the proper power level, the galvanometer controlled mirror can periodically reflect the laser beam to a power meter whose sensed power can then be utilized to provide any necessary adjustment of the power level from the pulsed laser source. In order to provide the first, second, and third sets of the scribes through the different layers, the average power levels of the lasers are respectively about 20 watts, about 8 to 9 watts, and about 4 to 5 watts.

Figure 1:
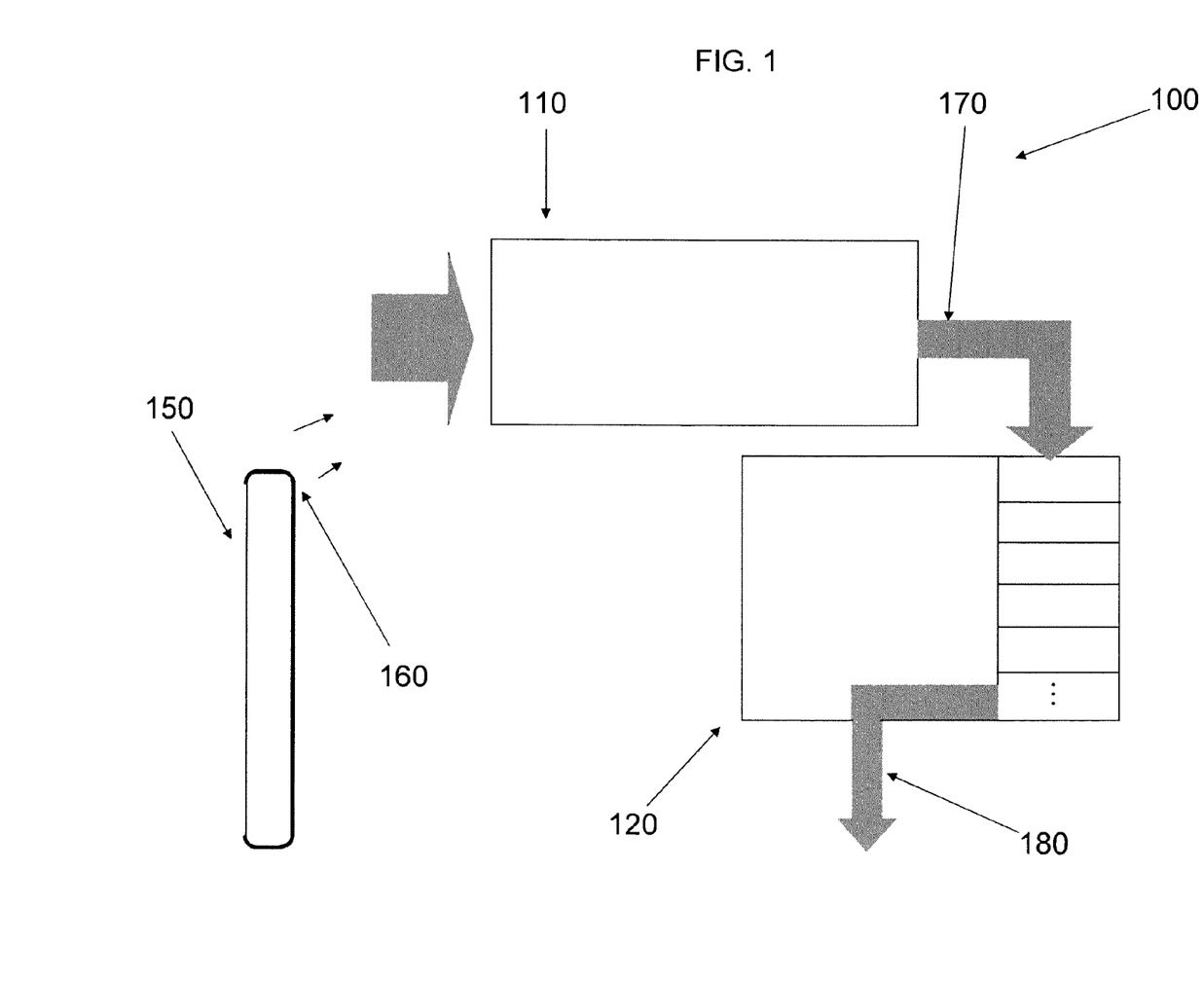
FIG. 1 is a schematic of a system for tracking the edge of a photovoltaic module.

Referring to FIG. 1 by way of example, a system for removing coating from a substrate 150 (e.g., a substrate for a photovoltaic module) can include an edge-tracking system 100. Edge-tracking system 100 can include a sensor 110 and a microprocessor 120. Sensor 110 and microprocessor 120 can communicate with one another via data interface 170, which can be operable to receive and communicate data relating to an edge position of substrate 150. Sensor 110 can be operable to detect and track the edge 160 of substrate 150 and can communicate a location edge identifier to microprocessor 120 via data interface 170. Sensor 110 may include any suitable position sensor, including, for example, an ultrasonic, infrared, non-contact, hall effect, proximity, or photodiode sensor. Edge 160 can include a top edge of substrate 150, a side of substrate 150, and/or a bottom edge of substrate 150. Edge 160 can be partially rounded. Edge 160 can be partially, substantially, or completely coated. Data interface 170 can be operable to receive and communicate data through any suitable means, including wireless or hardwire communications. In one embodiment, microprocessor 120 can be configured to receive a location edge identifier from sensor 110 via data interface 170. Microprocessor 120 can be configured to calculate an adjustment identifier based on the location edge identifier and a stored width identifier, where the width identifier defines a minimum non-coated width for an edge 160 of substrate 150. The width identifier can represent a designated industry standard, or any other requirement. Microprocessor 120 can output the adjustment identifier via data interface 180. Data interface 180 can communicate the adjustment identifier using any suitable form of communications, including wireless or hardwire communications.

Figure 2:
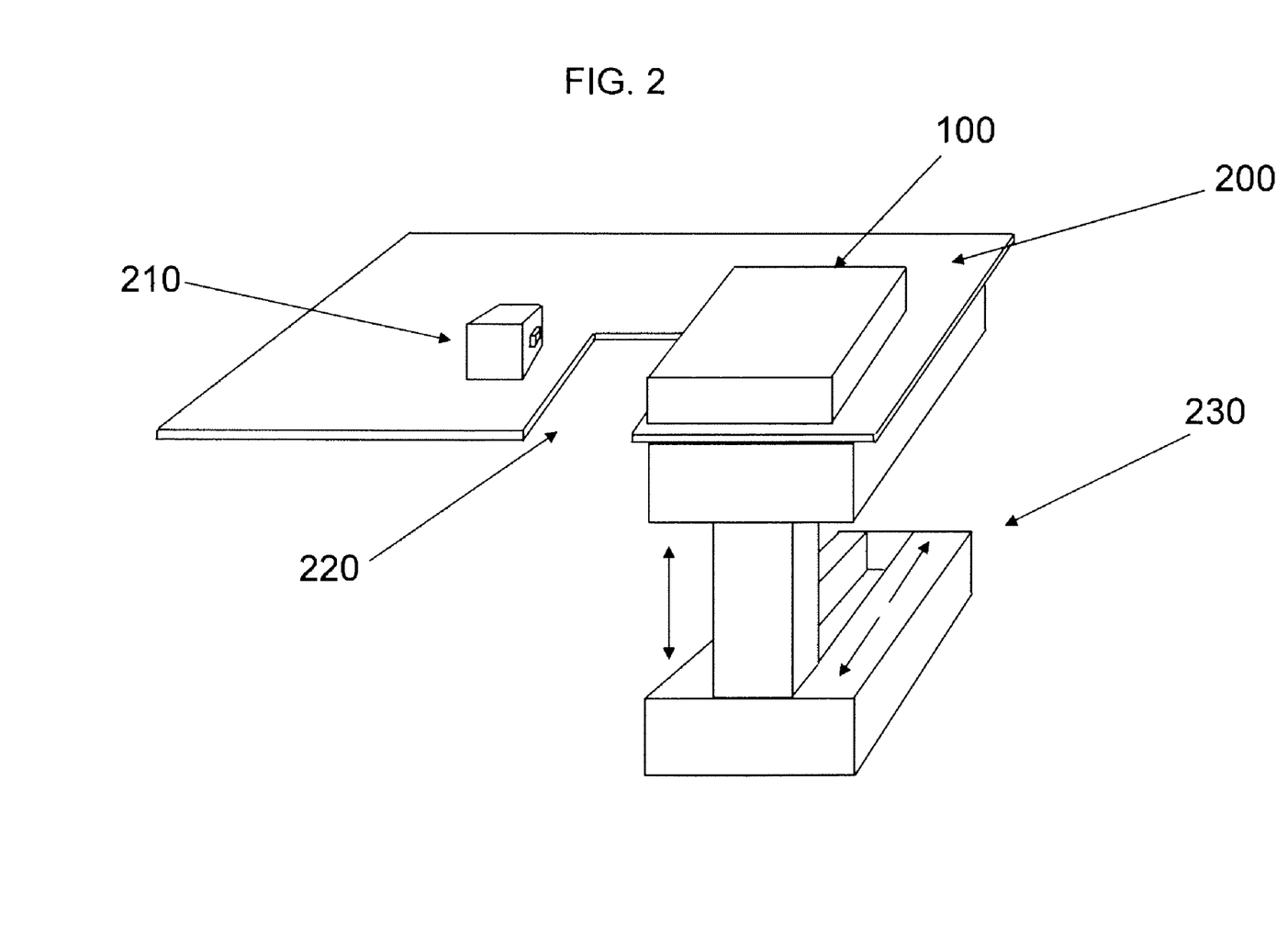
FIG. 2 is a schematic of a system for removing material from a photovoltaic module.
Figure 3A:
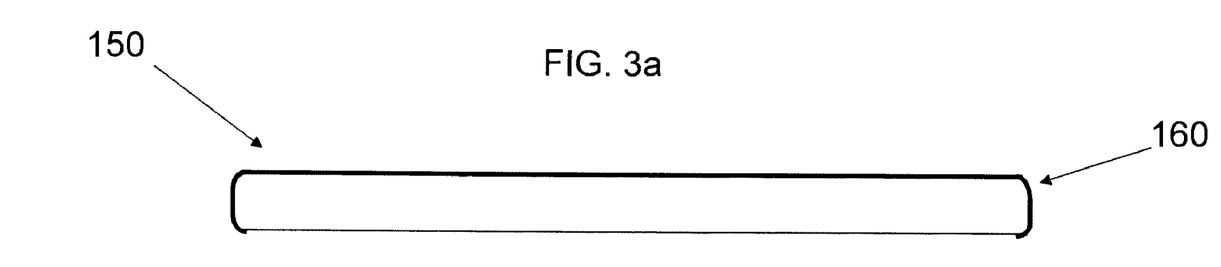
FIG. 3a is a schematic of a photovoltaic module.
Figure 3B:
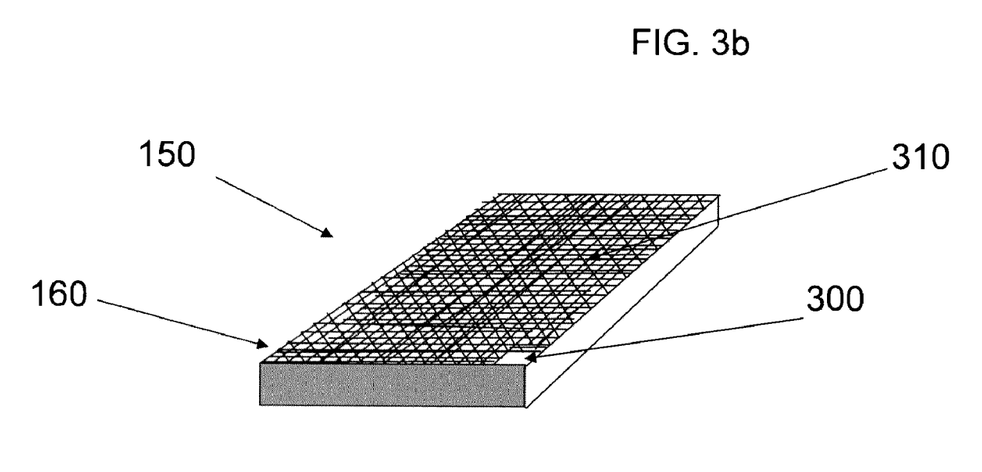
FIG. 3b is a schematic of a photovoltaic module.
Figure 8A:
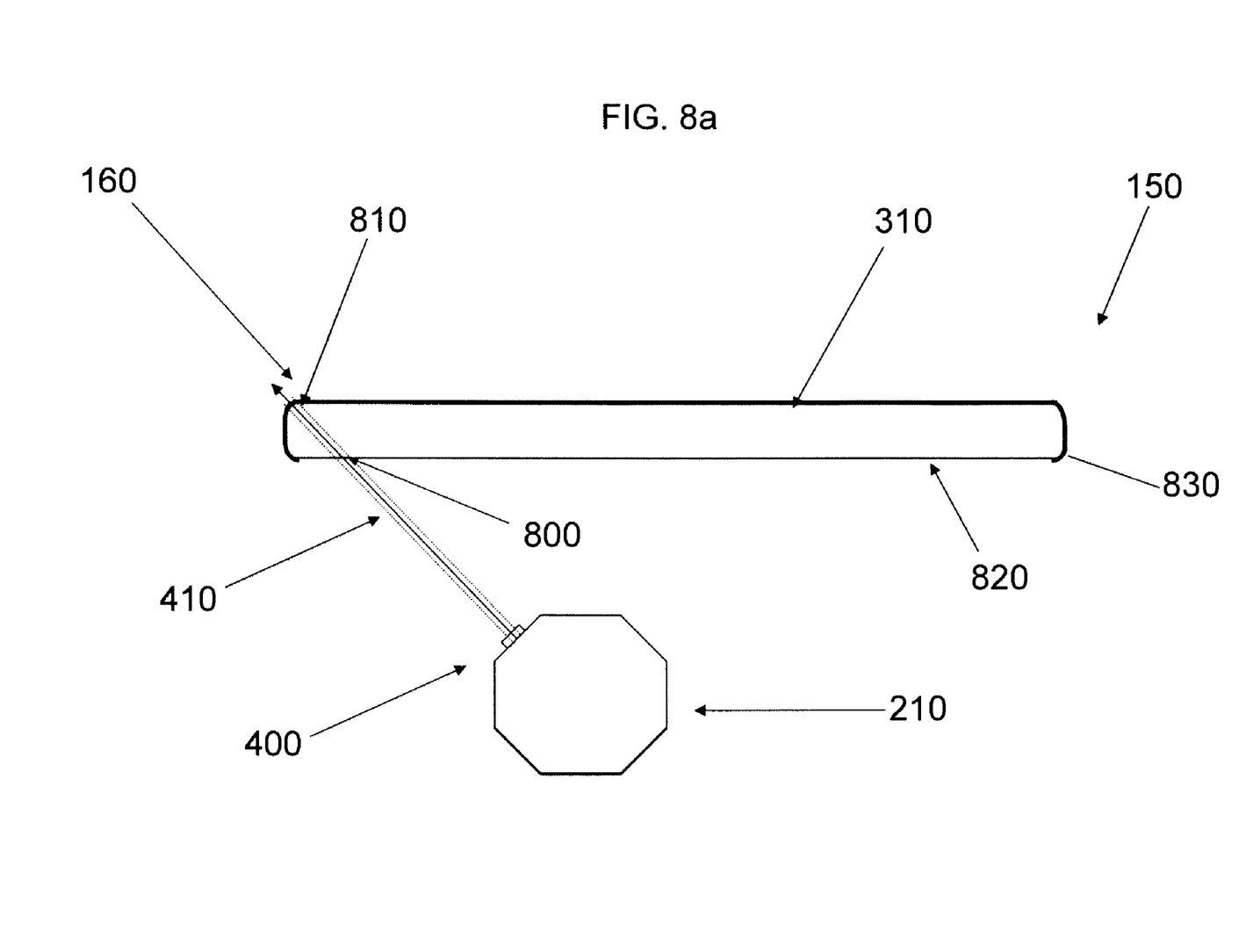
FIG. 8a is a schematic of a system for removing material from a photovoltaic module.
Figure 8B:
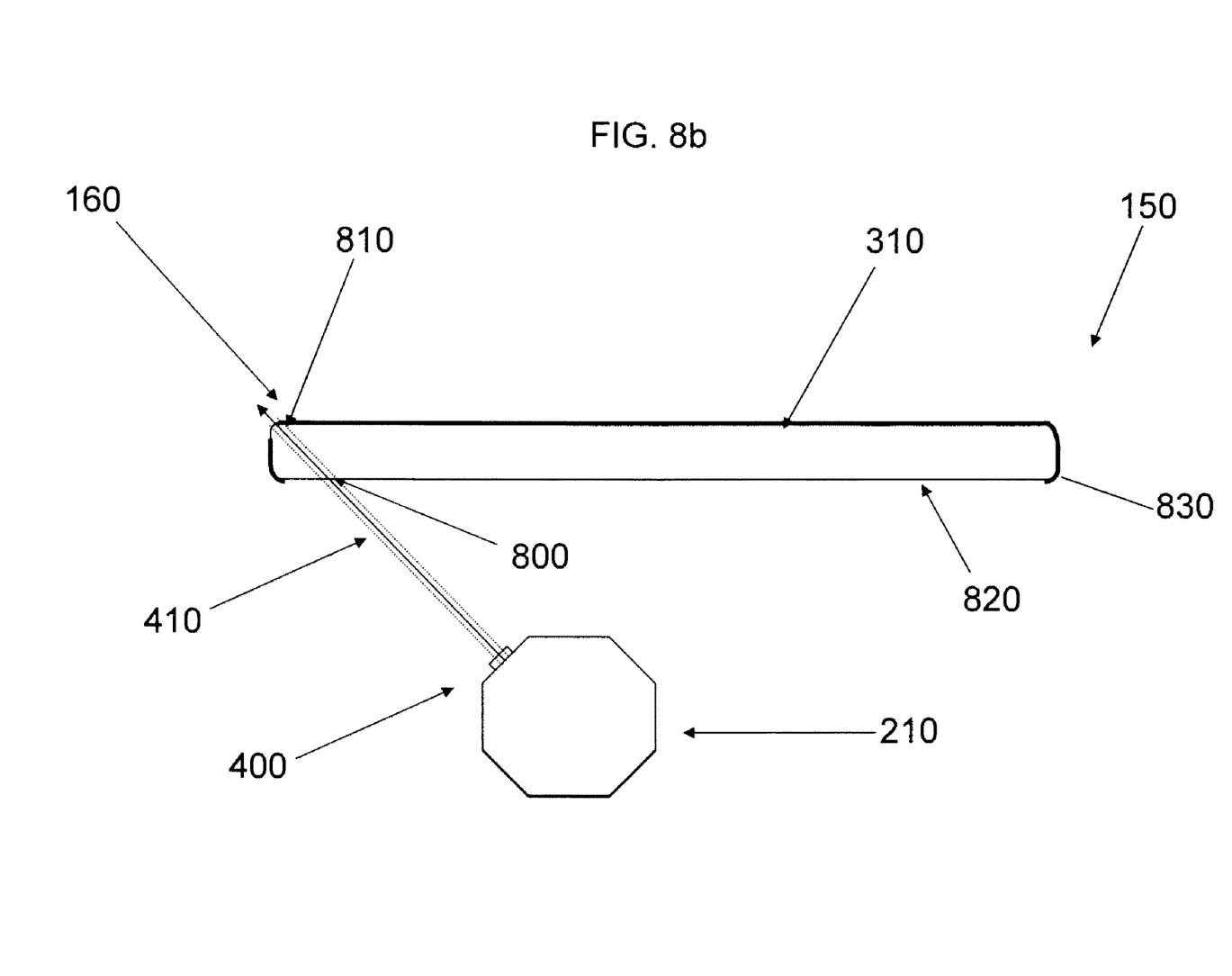
FIG. 8b is a schematic of a system for removing material from a photovoltaic module.

Referring to FIG. 2, edge-tracking system 100 can be mounted adjacent to mounting plate 200. Mounting plate 200 can include a gap 220 such that two portions of mounting plate 200 lie partially separate and parallel from each other. Gap 220 can be configured to receive substrate 150. Referring to FIGS. 1 and 2, mounting plate 200 can be mounted adjacent to actuator 230, which can be configured to receive an adjustment identifier from microprocessor 120 via data interface 180. Actuator 230 can also be configured to adjust the position of mounting plate 200 based on the received adjustment identifier in any necessary direction. For example, actuator 230 can be configured to adjust mounting plate 200 in a horizontal plane, a vertical plane, or any combination thereof. Referring to FIG. 2, coating-removal device 210 can be mounted anywhere on mounting plate 200. For example, coating-removal device 210 can be mounted along an edge of gap 220. Referring to FIGS. 2, 3a, and 3b, coating-removal device 210 can be configured to remove a portion of coating layer 310 from edge 160 of substrate 150 to form first non-coated section 300. Coating-removal device 210 can include any suitable device for removing coating from a photovoltaic device. For example, coating-removal device 210 can contain a laser source. FIGS. 4a, 4b, 8a, and 8b, by no way of limitation, depict use of a coating-removal device 210 containing a laser source 400. By directing a laser beam 410 at the glass substrate side 820 of substrate 150, a portion of coating layer 310 can be removed from edge 160 as laser beam 410 passes through the coated opposite side of substrate 150, as depicted in FIG. 8b. Coating-removal device 210 can be configured to scan substrate 150 to remove additional portions of coating layer 310.

Referring back to FIGS. 3a and 3b, coating layer 310 can include any suitable coating material for the fabrication of photovoltaic modules, and can consist of multiple layers. For example, coating layer 310 can include a cadmium or a silicon. Coating layer 310 can include an amorphous silicon. Coating layer 310 can include a compound semiconductor material. For example, coating layer 310 can include a cadmium telluride layer and/or a cadmium sulfide layer. Coating-removal device 210 from FIG. 2 can be configured to remove some or all of coating layer(s) 310 from substrate 150.

Figure 9:
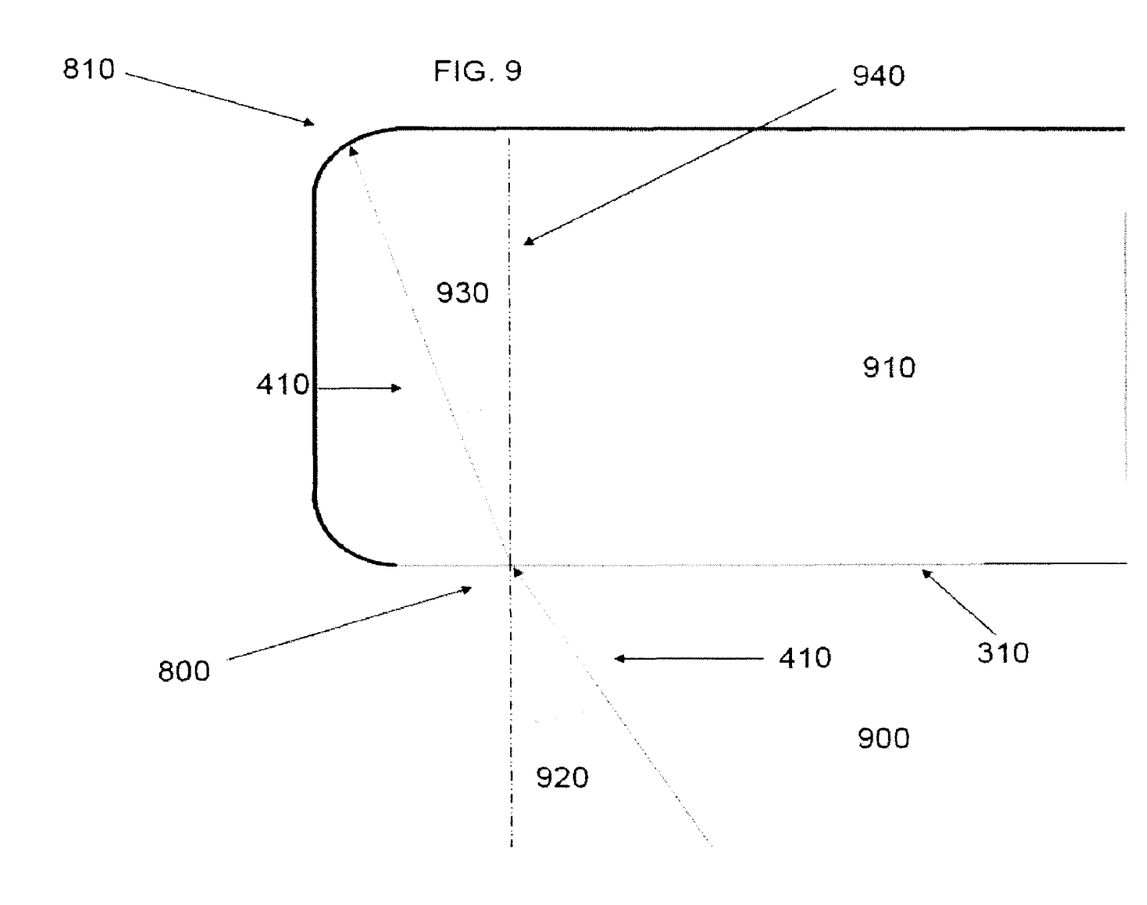
FIG. 9 is a schematic of a photovoltaic module.

The path of laser beam 410 through substrate 150 is predictable. Referring to FIGS. 8a, 8b, and 9 by way of example, laser beam 410 enters substantially flat non-coated side 310 of glass layer 830 at laser entry point 800 at angle of incidence 920 relative to normal 940. The refractive index 910 of glass layer 830 differs from the external refractive index 900 outside substrate 150, altering the speed, angle, and path of laser beam 410 once it passes through glass layer 830. Laser beam 410 extends through glass layer 830 at angle of refraction 930, relative to normal 940, to laser exit point 810. The angle of refraction 930 is relatable to the angle of incidence 920 by the following: $\eta_1 * \sin \theta_1 = \eta_2 * \sin \theta_2$, where $\eta_1$ defines the external refractive index 900, $\eta_2$ defines the glass layer refractive index 910, $\theta_1$ defines the angle of incidence 920, and $\theta_2$ defines the angle of refraction 930. The refractive indices can thus be used to trace and predict laser exit point 810 of laser beam 410, allowing for strategic placement of substrate 150 relative to the position and angle of the laser. The calculations relating to the predictive path of laser beam 410 can be calculated externally, or within coating-removal device 210.

Figure 4A:
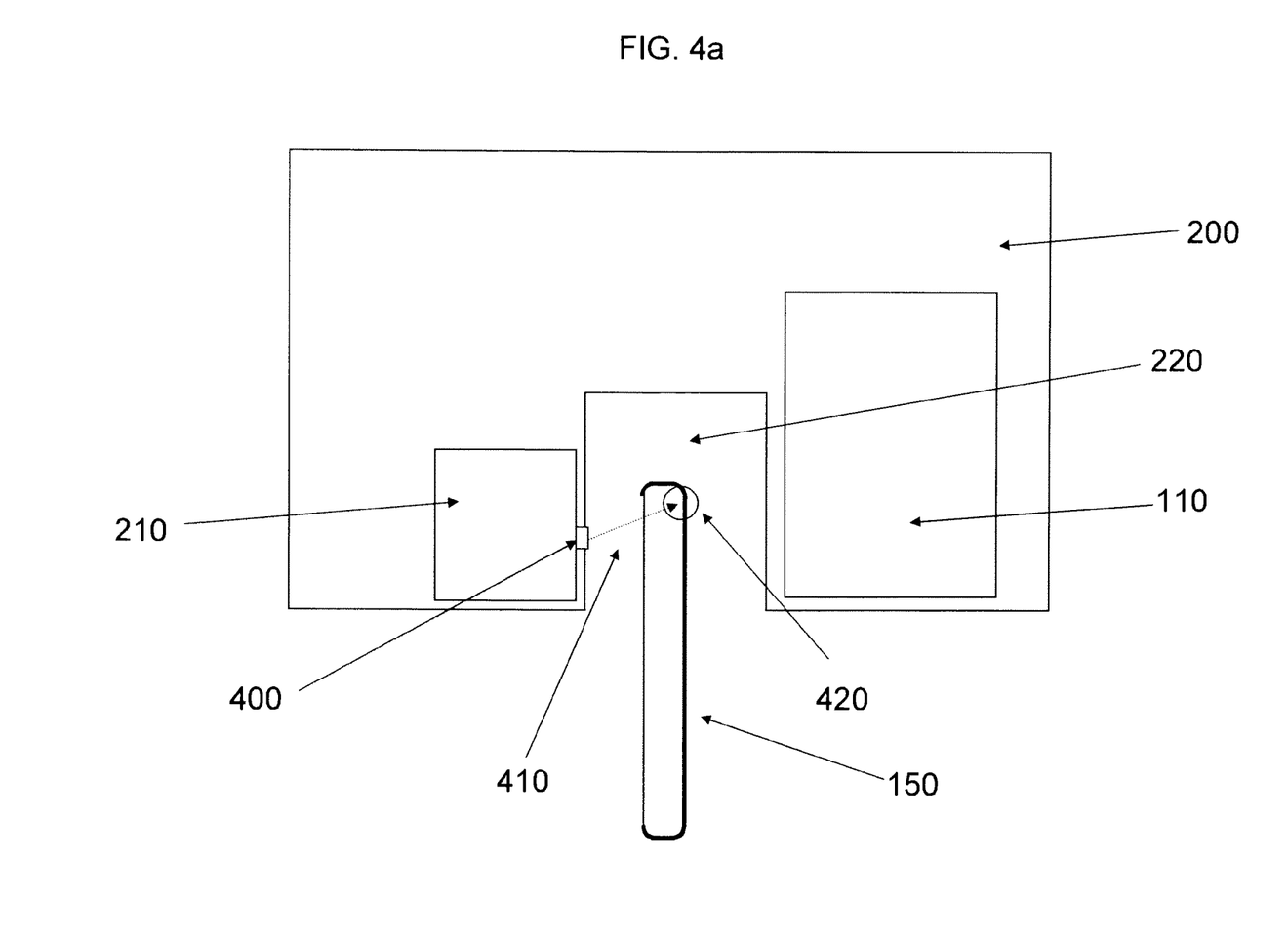
FIG. 4a is a schematic of a system for removing material from a photovoltaic module.
Figure 4B:
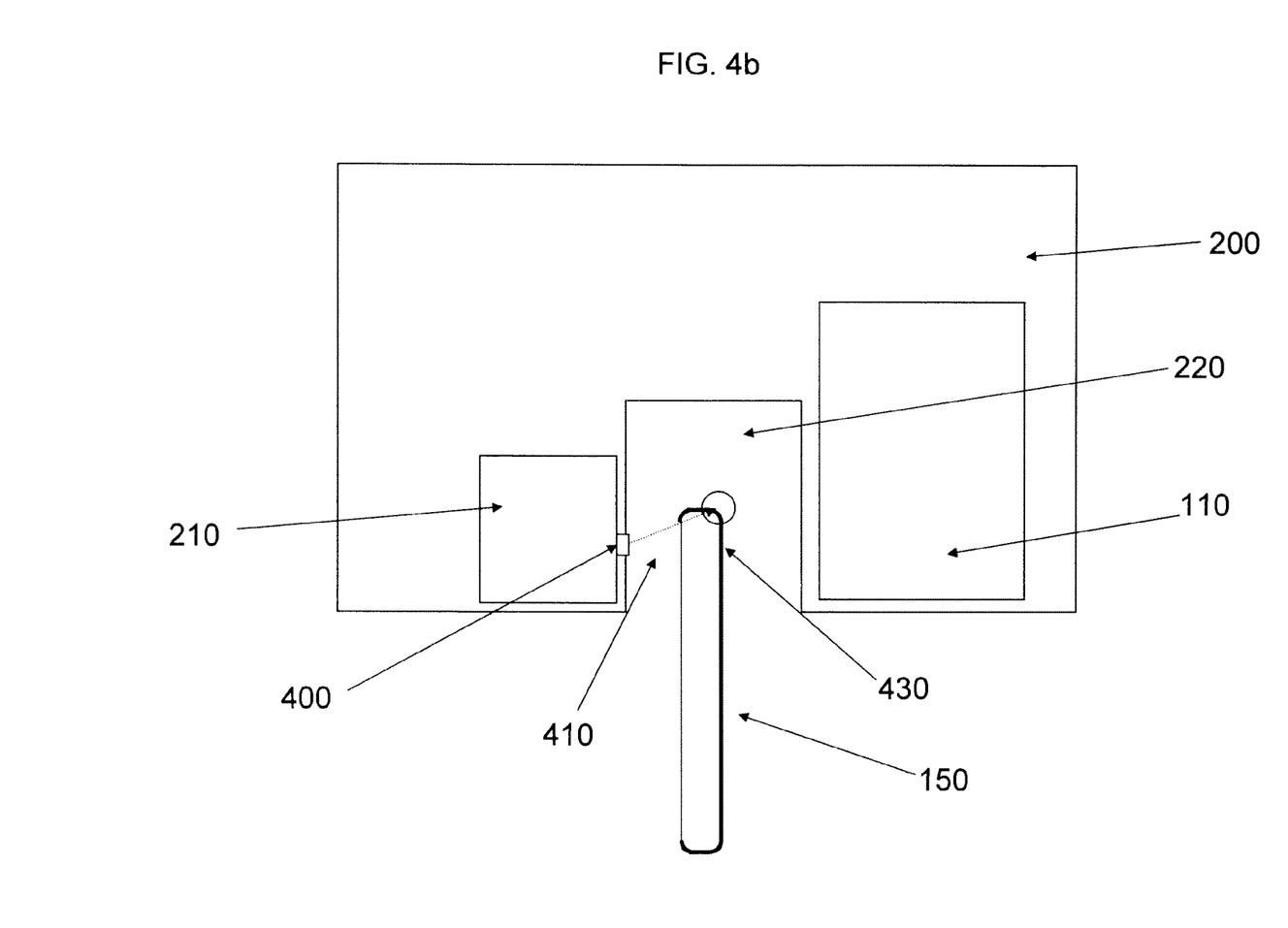
FIG. 4b is a schematic of a system for removing material from a photovoltaic module.
Figure 5:
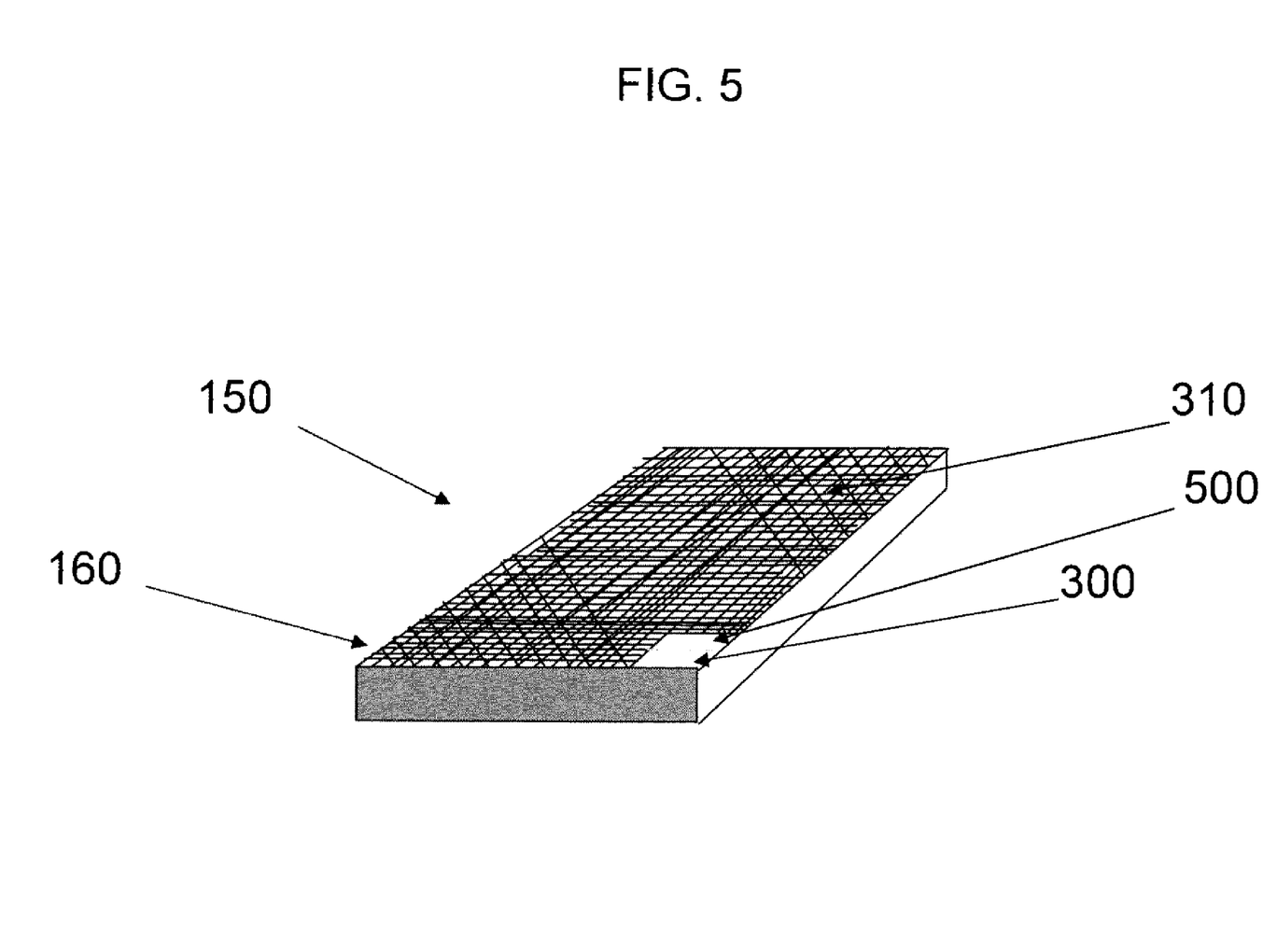
FIG. 5 is a schematic of a photovoltaic module.
Figure 6A:
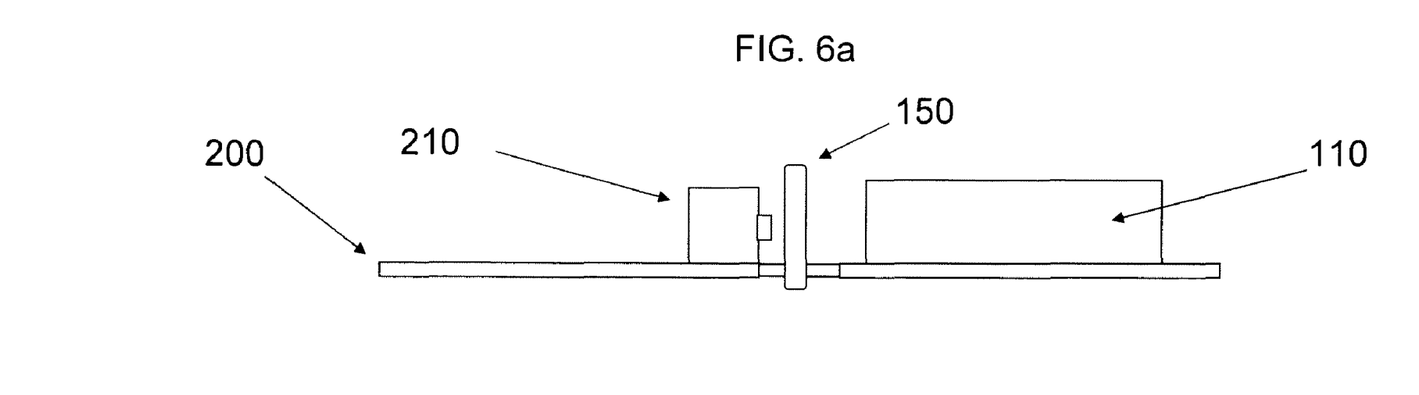
FIG. 6a is a schematic of a system for removing material from a photovoltaic module.
Figure 6B:
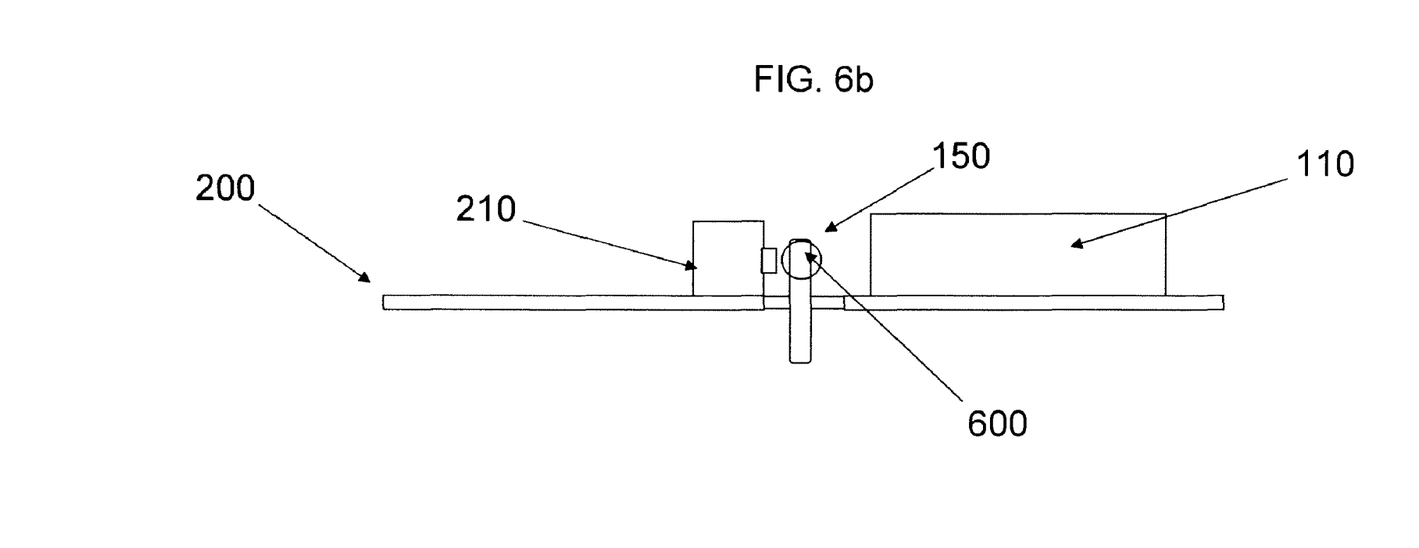
FIG. 6b is a schematic of a system for removing material from a photovoltaic module.
Figure 7:
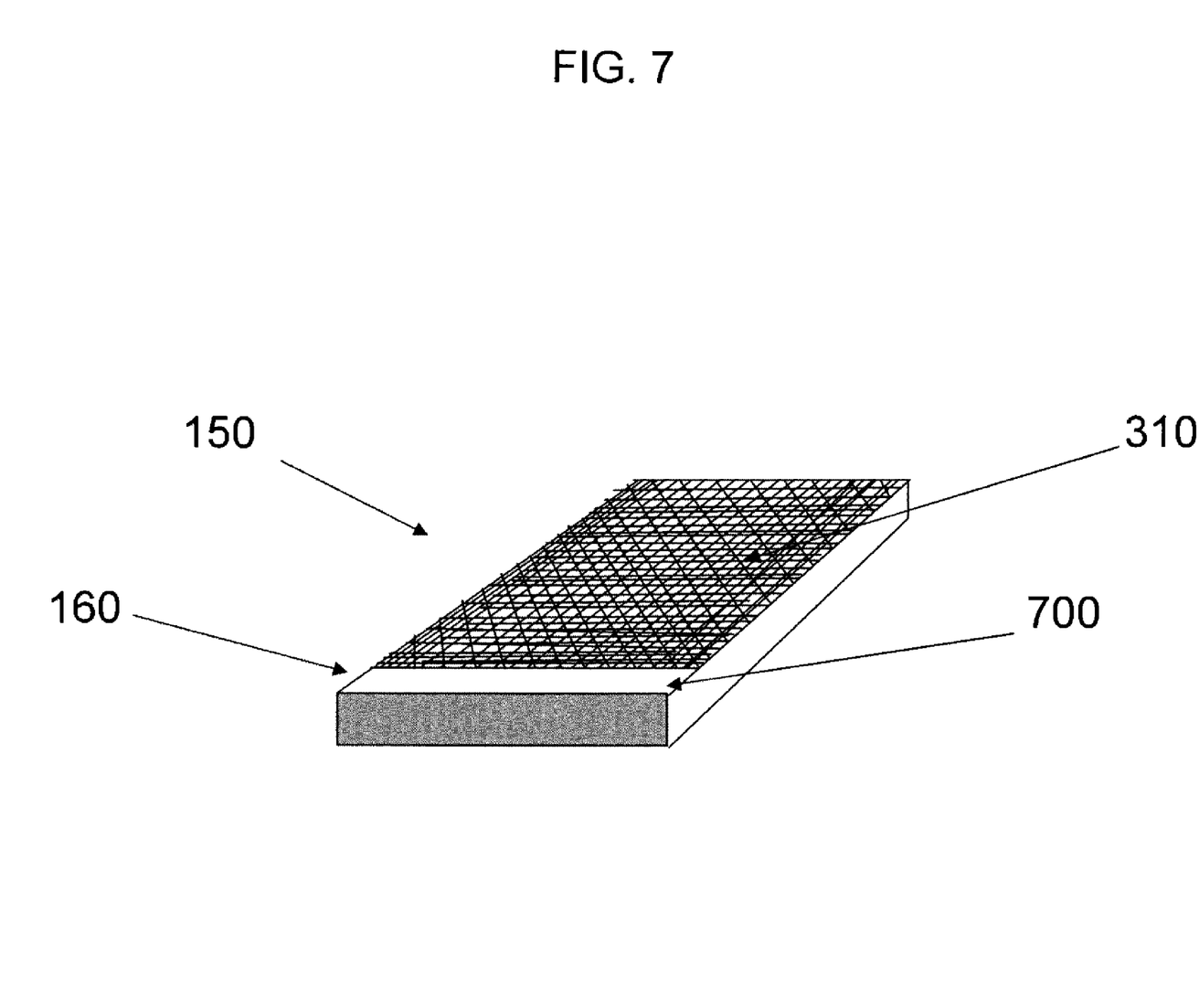
FIG. 7 is a schematic of a photovoltaic module.

Referring to FIGS. 2, 4a, and 4b, actuator 230 can be further configured to adjust mounting plate 200 from a first position 420 to a new position 430. Actuator 230 can adjust mounting plate 200 to a multitude of new positions 430. Each of the new positions 430 permits coating-removal device 210 to operate on a new area of coating to form one or more contiguous non-coated sections 500 adjacent to the first non-coated section 300. Referring to FIGS. 6a and 6b, substrate 150 can also be adjusted (by an actuator, a robotic arm, or any other suitable means), so that a new coated section 600 is positioned in front of coating-removal device 210. In one embodiment, new coated section 600 may lie laterally adjacent to a non-coated section. The non-coated section can be any of first non-coated section 300, any of the one or more contiguous non coated sections 500, or any combination thereof. The plane of adjustment for substrate 150 can differ from the plane of adjustment for mounting plate 200. For example, mounting plate 200 can be adjusted in a horizontal plane, allowing coating-removal device 210 to move along a designated minimum non-coated edge width. Substrate 150 can be passed through gap 220 to allow coating-removal device 210 to effectively operate on an adjacent column of width on the edge 160 of substrate 150. Referring to FIG. 7 by way of example, if both mounting plate 200 and substrate 150 are adjusted and readjusted in the manner discussed herein, a continuous segment 700 of non-coated edge consistent with the desired non-coated edge width can be obtained.

Photovoltaic devices/modules fabricated using the methods discussed herein may be incorporated into one or more photovoltaic arrays. The arrays may be incorporated into various systems for generating electricity. For example, a photovoltaic module may be illuminated with a beam of light to generate a photocurrent. The photocurrent may be collected and converted from direct current (DC) to alternating current (AC) and distributed to a power grid. Light of any suitable wavelength may be directed at the module to produce the photocurrent, including, for example, more than 400 nm, or less than 700 nm (e.g., ultraviolet light). Photocurrent generated from one photovoltaic module may be combined with photocurrent generated from other photovoltaic modules. For example, the photovoltaic modules may be part of a photovoltaic array, from which the aggregate current may be harnessed and distributed.

The embodiments described above are offered by way of illustration and example. It should be understood that the examples provided above may be altered in certain respects and still remain within the scope of the claims. It should be appreciated that, while the invention has been described with reference to the above preferred embodiments, other embodiments are within the scope of the claims.

What is claimed is:

1. A method for removing coating from a substrate, the method comprising:
locating an edge of a substrate;

directing a laser beam along a first path to a first position on a surface of the substrate proximate to an edge of the substrate at an angle of incidence suitable to redirect the laser beam along a second path, through the substrate, to a second position on a second surface of the substrate corresponding to the located edge of the substrate, the second surface comprising a coating; and ablating at least a portion of coating at the second position on the second surface of the substrate.

2. The method of claim 1, further comprising scanning the laser beam along a region proximate to the located edge of the substrate.

3. The method of claim 2, wherein the scanning comprises adjusting a substrate to one or more new positions.

4. The method of claim 2, wherein the scanning comprises adjusting a laser source to one or more new positions.

5. The method of claim 2, wherein the scanning comprises forming one or more contiguous non-coated sections adjacent to a first non-coated section.

6. The method of claim 1, wherein the ablating comprises forming a first non-coated section.

7. The method of claim 6, wherein the first non-coated section substantially equates to a minimum non-coated edge width.

8. The method of claim 6, wherein the ablating comprises forming one or more contiguous non-coated sections, wherein the combination of one or more contiguous non-coated sections and the first non-coated section substantially equates to a minimum non-coated edge width.

9. The method of claim 1, further comprising adjusting a substrate to one or more new positions.

10. The method of claim 9, wherein the adjusting comprises repositioning the substrate in a horizontal plane, a vertical plane, or both.

11. The method of claim 1, further comprising adjusting a laser source to one or more new positions.

12. The method of claim 11, wherein the adjusting comprises repositioning the laser source in a horizontal plane, a vertical plane, or both.

13. A system for removing coating from a substrate, the system comprising:
   a first data interface operable to receive and communicate data relating to one or more edges of a substrate;
   a second data interface operable to receive and communicate data relating to one or more edges of a substrate;
   a sensor in communication with the first data interface, the sensor operable to detect and track the edge of a substrate and further operable to output a location edge identifier via the first data interface, the location edge identifier defining the location of an edge of a substrate;
   a controller in communication with the sensor, the controller configured to receive the location edge identifier from the sensor via the first data interface, and to output an adjustment signal based on the received location edge identifier; and
   a coating-removal device configured to remove a portion of coating from an edge of a substrate to form one or more non-coated sections, the coating-removal device comprising a laser source.

14. The system of claim 13, wherein the controller is further configured to receive an edge width identifier, and to output an adjustment signal based on the edge width identifier, the edge width identifier defining a minimum edge width for a substrate.

15. The system of claim 13, further comprising an actuator, wherein the actuator is configured to receive the adjustment signal from the controller via the second data interface.

16. The system of claim 15, wherein the actuator is configured to: adjust a substrate to one or more new positions based on the received adjustment signal; adjust a mounting plate to one or more new positions based on the received adjustment signal; or adjust the mounting plate in a horizontal plane, a vertical plane, or both.

17. The system of claim 16, wherein the actuator is configured to reposition the substrate in a horizontal plane, a vertical plane, or both.

18. The system of claim 16, wherein the mounting plate comprises a gap, such that two portions of the mounting plate lie partially separate and parallel from each other, wherein the gap is configured to receive a substrate.

19. The system of claim 16, wherein: the coating-removal device is mounted along an edge of the gap; or the coating-removal device, controller, or sensor is positioned on the mounting plate.

20. The system of claim 13, wherein the sensor comprises an ultrasonic, infrared, non-contact, hall effect, proximity, or photodiode sensor.

* * * * *